United States Patent [19]

Yamana et al.

[11] Patent Number: 5,147,851
[45] Date of Patent: Sep. 15, 1992

[54] SUPERCONDUCTING THICK FILM CIRCUIT BOARD, PRODUCTION THEREOF, THICK FILM SUPERCONDUCTOR AND PRODUCTION THEREOF

[75] Inventors: Shozo Yamana, Hitachi; Hideji Kuwajima, Katsuta; Minoru Ishihara, Katsuta; Keiji Sumiya, Katsuta; Toranosuke Ashizawa, Katsuta; Shuichiro Shimoda, Katsuta, all of Japan

[73] Assignee: Hitachi Chemical Company Ltd.

[21] Appl. No.: 428,946

[22] Filed: Oct. 30, 1989

[30] Foreign Application Priority Data

Nov. 2, 1988 [JP] Japan ............................ 63-277968
Feb. 15, 1989 [JP] Japan ............................ 1-33708
Oct. 11, 1989 [JP] Japan ............................ 1-264665

[51] Int. Cl.$^5$ .............................................. B32B 9/00
[52] U.S. Cl. ........................................ 505/1; 505/701; 505/702; 505/703; 505/704; 361/397; 428/426; 428/432; 428/433; 428/457; 428/688; 428/700; 428/901; 428/930
[58] Field of Search ............ 505/1, 701–704; 428/426, 432, 433, 457, 688, 700, 901, 930; 361/397

[56] References Cited

FOREIGN PATENT DOCUMENTS 0292125  11/1988  European Pat. Off. .

OTHER PUBLICATIONS

Applied Physics Letters, vol. 55, No. 5, Jul. 31, 1989, Chu et al., p. 492ff.
IEEE Traansactions on Magnetics, vol. 25, No. 2, Mar. 1989, Aatsuma et al., p. 2487ff.
Translation Japanese Article, 1988 Imanaka et al.
Applied Physics Letters, vol. 53, No. 2, "Pt-coated substrate effect on oxide superconductive films . . . ".
Applied Physics Letters, vol. 51, No. 13, "Preparation and substrate reactions of superconducting Y-Ba-Cu-O . . . ".

Primary Examiner—Patrick J. Ryan

[57] ABSTRACT

A superconducting thick film circuit board or thick film superconductor obtained by forming a rod-like crystal superconducting composite layer comprising a superconductor made of a compound of M-Ba-Cu-O, M being Y and/or a lanthanide element, and a composite of Ag and Pt on a stabilized zirconia substrate has a high Jc value and good superconducting properties.

6 Claims, 2 Drawing Sheets

SUPERCONDUCTING THICK FILM CIRCUIT BOARD, PRODUCTION THEREOF, THICK FILM SUPERCONDUCTOR AND PRODUCTION THEREOF

BACKGROUND OF THE INVENTION

This invention relates to a superconducting thick film circuit board, a process for producing the same, a thick film superconductor, and a process for producing the same.

Intermetallic compounds of $Nb_3Sn$, $GaV_3$, $Nb_3Ge$, etc. used as a superconductor heretofor are as high as 16.8 to 23K in the critical temperature compared with known NbTi and show a critical magnetic field of 20 to 40 teslas at 4.2K, so that they were practically used as superconducting coils, Josephson devices, etc. But these compounds of $Nb_3Sn$, $GaV_3$, $Nb_3Ge$, etc. have a defect in that the temperature for showing superconductivity is lower than the liquid nitrogen temperature (77.3K). For example, the temperature showing superconductivity (hereinafter referred to as "$T_c^{onset}$") and the temperature showing complete superconductivity and resistivity of zero (hereinafter referred to as "$T_c^{zero}$") are 30K or less, respectively. Therefore, in order to use these compounds as a superconductor practically, it is necessary to use very expensive liquid helium, which disadvantageously requires complicated apparatus.

In order to improve such defects, super-conductors using compounds of Ba-La-Cu-O series were developed as disclosed in New Superconducting Materials Forum, 1st Symposium Proceeding, pp. 24-33 (1987). By these superconductors, the critical temperature was raised above 30K. Further, by superconductors of Y-Ba-Cu-O series compounds subsequently found, the critical temperature was raised to the order of 90K, which temperature is higher than the liquid nitrogen temperature of 77.3K. A superconductor using a Y-Ba-Cu-O series compound has a critical current density (hereinafter referred to as "Jc") of as high as $1.8 \times 10^6$ $A/cm^2$ at the liquid nitrogen temperature when measured as to a single crystal thin film formed by sputtering on a strontium titanate ($SrTiO_3$) single crystal substrate (New Superconducting Material Research Society, 3rd Symposium Proceeding, pp. 61-75 (1987)).

On the other hand, a superconducting thick film circuit board obtained by adding $Ag_2O$ to superconducting powder of Y-Ba-Cu-O series has Jc of 1300 $A/cm^2$ at the liquid nitrogen temperature as disclosed in a Resume of Lectures at Autanum Meeting of the Society of Powder Metallurgy, p. 24 (1988).

But in the former case, although there is obtained a high Jc of $1.8 \times 10^6$ $A/cm^2$, there are many defects in that the cost is very high due to the use of a single crystal substrate, the size of substrate is limited, and it is difficult to connect circuits formed on both sides of the substrate via a through-hole.

On the other hand, in the latter case, the Jc value of 1300 $A/cm^2$ is the case of the circuits having 40 $\mu m$ in thickness and 5 mm in width, but Jc is lowered to 600 $A/cm^2$ or less when the circuits have a thickness of 10 $\mu m$ and a width of 1 mm as shown in "Nikkei Superconductors" vol. 18, p. 2 (published on Oct. 3, 1988). Therefore, when a superconducting thick film circuit board having circuits of 0.5 mm or less in width is made, it can only be obtained the Jc value of as low as 600 $A/cm^2$ or less.

Further, a thick film superconductor of Y-Ba-Cu-O series has a defect in that Jc is greatly lowered by an external magnetic field as shown in Japanese Journal of Applied Physics, vol. 27, No. 2, pp. 185-187 (1988).

SUMMARY OF THE INVENTION

It is objects of the present invention to provide a superconducting thick film circuit board, a process for producing the same, a thick film super-conductor and a process for producing the same overcoming the defects as mentioned above.

The present invention provides a superconducting thick film circuit board comprising a stabilized zirconia substrate, and formed thereon a rod-like crystal superconducting composite layer comprising a super-conductor containing as major components a lanthanide element (except for Ce, Pr and Tb) and/or Y, Ba, Cu and O, and a composite of silver and platinum.

The present invention also provides a process for producing a superconducting thick film circuit board as mentioned above, which comprises forming a coating containing silver and platinum on a stabilized zirconia substrate, coating thereon a paste for super-conductor containing as major components a lanthanide element (except for Ce, Pr and Tb) and/or Y, Ba, Cu and O, and calcining the resulting substrate at a temperature higher than the melting temperature of silver in an atmosphere containing oxygen.

The present invention further provides a thick film superconductor comprising a stabilized zirconia sintered body, and formed thereon a rod-like crystal superconducting composite layer comprising a super-conductor of a lanthanide element (except for Ce, Pr and Tb) and/or Y, Ba, Cu and O and a composite of silver and platinum.

The present invention still further provides a process for producing a thick film superconductor as mentioned above, which comprising forming a coating containing silver and platinum on a stabilized zirconia sintered body, coating thereon a paste for superconductor containing as major components a lanthanide element (except for Ce, Pr and Tb) and/or Y, Ba, Cu and O and calcining the resulting substrate at a temperature higher than the melting temperature of silver in an atmosphere containing oxygen.

DESCRIPTION OF THE PREFERRED EMBODIMENTS

Figure 1:
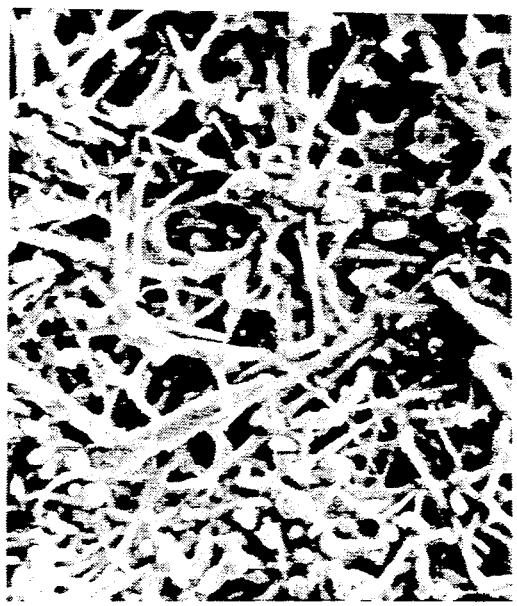
FIG. 1 is a photomicrograph showing a structure of crystals on the surface of circuit forming portion of a superconducting thick film circuit board obtained by calcining at 1000° C. for 5 hours according to the present invention.

The present inventors have studied for improving Jc of superconducting thick film circuit boards, thick film superconductors, etc., and magnetic field dependency of Jc of thick film superconductors. As a result, it was found that silver containing platinum remarkably accelerates the growth of particles of the super-conductor at a temperature in which the silver is molten or higher, and by the particle growth, the super-conductor grows to rod-like crystals, which results in giving a high Jc of 1000 A/cm$^2$ or more even in the case of circuit width being 0.5 mm, and the Jc of thick film superconductor is not greatly lowered even if an external magnetic field is applied. Further, it was also found that by forming a rod-like crystal superconducting composite layer comprising a superconductor containing as major components a lanthanide element (except for Ce, Pr and Tb) and/or Y, Ba, Cu and O, and a composite of silver and platinum on a stabilized zirconia substrate, a high Jc of 1000 A/cm$^2$ or more can be obtained. In addition, it was also found that there can be obtained thick film superconductors remarkably improved in prevention of greatly lowering in the Jc by an external magnetic field when a rod-like crystal superconducting composite layer comprising a superconductor containing as major components a lanthanide element (except for Ce, Pr and Tb) and/or Y, Ba, Cu and O, and a composite of silver and platinum is formed on a stabilized zirconia sintered body.

As the stabilized zirconia substrate and the stabilized zirconia sintered body, there can preferably be used those stabilized by yttrium oxide, cerium oxide, calcium oxide, etc.

These stabilized zirconia substrate and stabilized zirconia sintered body can be obtained by a conventional method. For example, a stabilized zirconia substrate or sintered body can be produced by using yttrium oxide, cerium oxide, calcium oxide, etc. as a stabilizer, more in detail, by mixing an yttrium oxide powder and a zirconium oxide powder, a cerium oxide powder and a zirconium oxide powder, or a calcium oxide powder and a zirconium oxide powder in predetermined amounts, heat treating the mixture at 1000° C. to 1500° C. to give a calcined body, mixing the calcined body with an aluminum compound such as aluminum oxide in a predetermined amount, mixing, purverlizing, molding, and calcining at a temperature of 1500° C. to 1700° C.

The rod-like crystals used in the present invention means those showing a shape of a rod having a small diameter with a long axis longer than a short axis, the ratio of long axis/short axis preferably being 5 or more, more preferably 8 or more.

The rod-like crystal superconducting composite layer can be formed by, for example, coating a paste for superconductor containing as major components a lanthanide element (except for Ce, Pr and Tb; that is La, Nd, Pm, Sm, Eu, Gd, Dy, Ho, Er, Tm, Yb or Lu) and/or Y, Ba, Cu and O, by a conventional process, using a thick film printing method on a coating of silver and platinum, and calcining the paste at a temperature of the melting point of silver or higher in an atmosphere containing oxygen.

The higher the proportion of the rod-like crystals becomes, the more preferable. But the presence of other crystal forms such as scales, bulks, etc. is possible so long as not disturbing the connection of rod-like crystals each other.

The coating formed on the stabilized zirconia substrate and the stabilized zirconia sintered body should be the coating containing silver and platinum. The use of other metal coating does not make it possible to form the rod-like crystal superconducting composite layer.

The formation of the coating containing silver and platinum can be carried out by a thick film printing method using a paste containing silver and platinum, a plating method, a vapor deposition method, a flame spraying method, or the like. There is no particular limitation thereto.

The thickness of the coating containing silver and platinum is preferably 5 μm or more, more preferably 10 μm to 30 μm.

As a powder containing silver as a main component, there can be used a powder of silver, silver oxide, silver chloride, silver nitrate, etc. alone or as a mixture thereof. There is no limitation thereto so long as such a powder can form metallic silver after calcination.

As a powder containing platinum as a main component, there can be used a powder of platinum, platinum oxide, etc. alone or as a mixture thereof. There is no limitation thereto so long as such a powder can form metallic platinum after calcination.

Mixing ratio of silver and platinum is preferably 99.9 to 90% by weight of silver and 0.1 to 10% by weight of platinum.

The paste for superconductor can be produced by uniformly mixing, for example, a lanthanide element (except for Ce, Pr and Pb) and/or Y, Ba and Cu in the form of salts or oxides, an organic binder, an organic solvent, etc. As the organic binder, there can be used polyvinyl alcohol, ethyl cellulose, methyl cellulose, etc. As the organic solvent, there can be used terpineol, ethyl Cellosolve, methyl Cellosolve, ethylene glycol monobutyl ether, etc. As the paste for superconductor, it is possible to use a paste obtained by using powders showing superconductivity, or a paste obtained by using powders showing superconductivity after calcining.

More simply, the compounds for making the superconductor can be represented by the formula:

$$M\text{-}Ba\text{-}Cu\text{-}O$$

wherein M is Y and/or a lanthanide element selected from the group consisting of La, Nd, Pm, Sm, Eu, Gd, Dy, Ho, Er, Tm, Yb and Lu. Among these lanthanide elements, Er, Ho and Yb are preferable.

As to the proportions of individual components in the superconductor, it is preferable to make the atomic ratio of a lanthanide element (except for Ce, Pr, and Tb) and/or Y (that is M), $M:Ba:Cu = 1\pm0.1: 2\pm0.2:3\pm0.3$ in order to make $T_c^{zero}$ higher.

Preferable examples of the superconductor are as follows:
- Y-Ba-Cu-O series compounds,
- Ho-Ba-Cu-O series compounds,
- Yb-Ba-Cu-O series compounds, and
- Er-Ba-Cu-O series compounds.

As to the calcining conditions, it is necessary to calcine in an atmosphere containing oxygen at a temperature higher than the melting point of silver and preferably lower than 1100° C. When the calcination is carried out in an atmosphere containing no oxygen, it is necessary to calcine again in an atmosphere containing oxygen in order to obtain the desirable properties. Further, when the calcining temperature is lower than the melting point of silver, it is impossible to obtain Jc of 1000 A/cm$^2$ or more in the case of the circuit width of 0.5 mm.

In the present invention, the term "calcination" includes a procedure from the temperature rise to the temperature lowering. The atmosphere at the temperature rise preferably contains oxygen, but not always required. But in the case of the temperature lowering, oxygen should be included in the atmosphere.

The calcination temperature can be selected properly depending on the kind of superconductor powders used, compounding ratio, etc. It is preferable to calcine at a temperature of 980° C. or higher and lower than 1100° C.

The calcination time can be selected properly depending on the calcination temperature, and is usually 0.05 hour or more.

The superconducting thick film circuit board and the thick film superconductor of the present invention form the rod-like crystal superconducting composite layer on the surface. According to observation of cross section of the surface layer, silver is partly permeated in the superconducting composite layer.

The present invention is illustrated by way of the following Examples, in which all parts and percents are by weight unless otherwise specified.

EXAMPLE 1, COMPARATIVE EXAMPLE 1

After weighing as starting materials Y$_2$O$_3$ (purity 99.9%, mfd. by Shin-Etsu Chemical Co., Ltd.), BaCO$_3$ (reagent grade, mfd. by Wako Pure Chemical Industries, Ltd.), and CuO (purity 99.9%, mfd. by High Purity Chemetals Co., Ltd.) so as to make the atomic ratio of Y:Ba:Cu=1:2:3, the starting materials were wet mixed using a ball mill made from a synthetic resin for 24 hours, followed by drying at 100° C. for 12 hours to yield a powder mixture. To 100 parts of the powder mixture, 3 parts of polyvinyl alcohol (reagent grade, mfd. by Wako Pure Chemical Industries, Ltd.) as an organic binder was added and mixed uniformly, followed by molding under a pressure of 1000 kg/cm$^2$ to give a disc of 30 mm in diameter and 2 mm in thickness. The disc was sintered at 950° C. for 10 hours. After crushing the sintered body in an agate mortar, wet pulverization was carried out using a ball mill made of zirconia for 24 hours to give a superconductor powder having an average particle size of 2.0 μm.

To 100 parts of the superconductor powder, 5 parts of ethyl cellulose (45 cp, mfd. by Wako Pure Chemical Industries, Ltd.) as an organic binder, and 20 parts of terpineol as an organic solvent were added and mixed uniformly to give a paste for superconductor.

On a zirconia substrate stabilized by cerium oxide (Halox 482, a trade name, mfd. by Hitachi Chemical Ceramics Co., Ltd.), a paste containing silver and platinum (TR-3817, a trade name, mfd. by Tanaka Matthey Co., Ltd.) was screen printed in the form of a circuit. After drying at 100° C. for 30 minutes, calcination was carried out at 900° C. for 10 minutes in the air to give a thick film circuit board forming a coating containing silver and platinum.

On the coating containing silver and platinum, the paste for superconductor obtained above was screen printed with the same circuit as the coating containing silver and platinum. Under calcining conditions as shown in Table 1 in an atmosphere of oxygen, calcination was carried to give superconducting thick film circuit boards having circuit widths of 0.5 mm and 3 mm. In the calcining step, the temperature was raised at a rate of 200° C./hour to the temperature shown in Table 1, and lowered to 300° C. at a cooling rate of 100° C./hour, followed by cooling to room temperature (in the following Examples and Comparative Examples, the same procedure as mentioned above being carried out).

The resulting superconducting thick film circuit boards were subjected to measurement of resistivity by changing temperatures by a so-called four probe method to give T$_c^{onset}$ and T$_c^{zero}$.

Jc was calculated from the current value when the voltage was lowered to 1 μV from a current-voltage curve and the cross-sectional area of a superconducting thick film circuit board (this method being applied to the following Examples and Comparative Examples). The measured values and calculated values at individual calcining temperatures are shown in Table 1. In Table 1, Jc means Jc at the liquid nitrogen temperature (77.3K).

The presence of rod-like crystals in the superconducting composite layer was observed by using a scanning type electron microscope at a magnification of 1000, and a ratio of long axis/short axis was also obtained (the same being applied in the following Examples).

The results of the observation and the ratio of long axis/short axis are also shown in Table 1.

Figure 2:
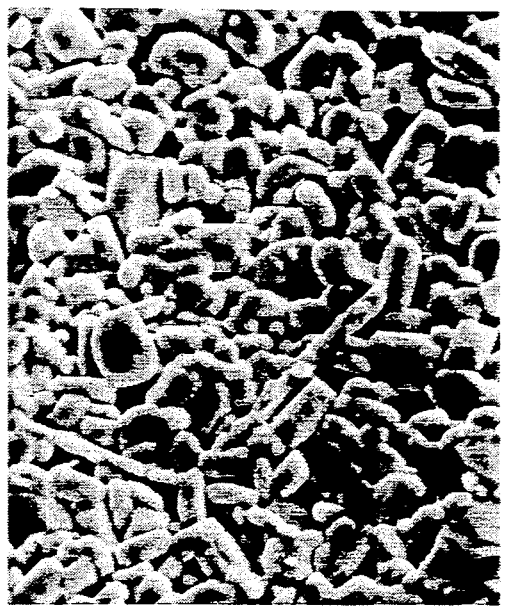
FIG. 2 is a photomicrograph showing a structure of crystals on the surface of circuit forming portion of a superconducting thick film circuit board obtained by calcining at 940° C. for 5 hours according to a Comparative Example.
Figure 3:
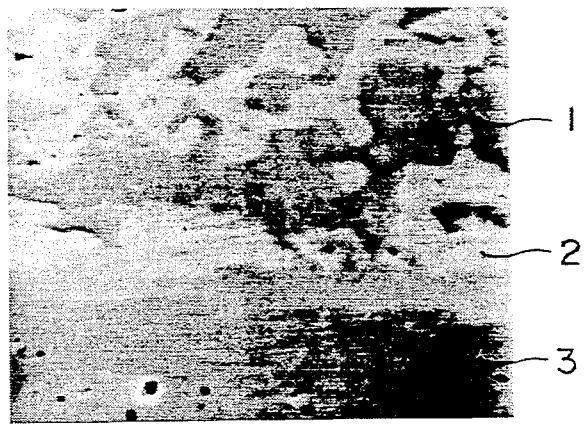
FIG. 3 is a photomicrograph showing a structure of cross section of circuit forming portion of a superconducting thick film circuit board obtained by calcining at 1000° C. for 5 hours according to the present invention.
Figure 4:
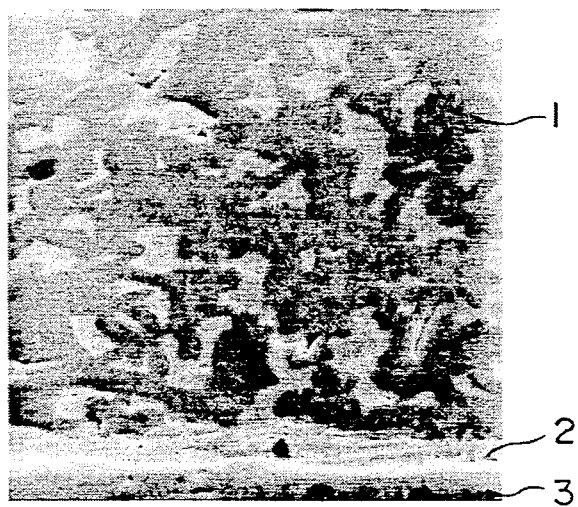
FIG. 4 is a photomicrograph showing a structure of cross section of circuit forming portion of a superconducting thick film circuit board obtained by calcining at 960° C. for 5 hours according to a Comparative Example.

Photomicrographs showing structures of crystals at the surface (upper surface) of circuit forming portions of superconducting thick film circuit boards obtained by calcining at 1000° C. and 940° C. for 5 hours are shown in FIGS. 1 and 2. Further, microphotographs showing structures of crystals at the cross section of circuit forming portions of the superconducting thick film circuit boards obtained in the same manner as mentioned above are shown in FIGS. 3 and 4. In FIGS. 3 and 4, numeral 1 denotes a superconducting composite layer, numeral 2 a coating containing silver and platinum, and numeral 3 a stabilized zirconia substrate.

TABLE 1

| Calcining conditions | | | | Jc (A/cm$^2$) | | Ratio of long axis/short axis |
|---|---|---|---|---|---|---|
| Temperature (°C.) | Time (hr) | T$_c^{onset}$ (K) | T$_c^{zero}$ (K) | Circuit width 0.5 mm | Circuit width 3.0 mm | of rod-like crystals |
| 940 | 5 | 92.4 | 90.1 | 151 | 132 | No rod-like crystals |
| 960 | 5 | 90.5 | 89.7 | 210 | 159 | " |
| 980 | 5 | 91.6 | 90.1 | 980 | 880 | " |
| 1000 | 5 | 93.1 | 90.8 | 1490 | 1520 | 8–12 |
| 1020 | 5 | 92.5 | 90.0 | 1640 | 1710 | 10–14 |
| 1040 | 5 | 91.4 | 89.9 | 1320 | 1400 | 8–12 |
| 1040 | 0.2 | 92.3 | 90.1 | 1040 | 1070 | 10–15 |
| 1060 | 0.2 | 92.0 | 90.3 | 2100 | 2020 | 10–17 |
| 1080 | 0.1 | 91.8 | 90.2 | 1320 | 1230 | 8–14 |

TABLE 1-continued

| Calcining conditions | | | | Jc (A/cm$^2$) | | Ratio of long axis/short axis |
| --- | --- | --- | --- | --- | --- | --- |
| Temperature (°C.) | Time (hr) | $T_c^{onset}$ (K) | $T_c^{zero}$ (K) | Circuit width 0.5 mm | Circuit width 3.0 mm | of rod-like crystals |
| 1100 | 0.1 | 91.3 | 89.8 | 490 | 640 | Unmeasurable |

As shown in Table 1, the superconducting thick film circuit boards obtained by calcining at 1000° C. to 1080° C. form rod-like crystals superconducting composite layers, have Jc of 1040 A/cm$^2$ or more, show slight differences between the circuit width of 0.5 mm and that of 3 mm, and show good superconducting properties with the ratio of long axis/short axis of 8 or more. $T_c^{onset}$ and $T_c^{zero}$ are as good as 89.9K or higher.

In contrast, the superconducting thick film circuit boards obtained by calcining at 940° to 980° C. show good values in both $T_c^{onset}$ and $T_c^{zero}$ of 89.9K or more, but do not deposit rod-like crystals and have Jc values of less than 1000 A/cm$^2$. Further, the super-conducting thick film circuit board obtained by calcining at 1100° C. shows good values in both $T_c^{onset}$ and $T_c^{zero}$ of 89.8K or more, but is impossible for measuring the ratio of long axis/short axis of rod-like crystals and has Jc of less than 1000 A/cm$^2$.

Further, as is clear from FIGS. 1 and 2, the superconducting thick film circuit board obtained by calcining at 1000° C. for 5 hours (FIG. 1) forms the rod-like crystal superconducting composite layer, but that obtained by calcining at 940° C. for 5 hours (FIG. 2) does not form the rod-like crystal superconducting composite layer.

In addition, as is clear from FIGS. 3 and 4, the superconducting thick film circuit board obtained by calcining at 1000° C. for 5 hours (FIG. 3) has a structure wherein the coating containing silver and platinum is almost penetrated into the superconducting composite layer, but that obtained by calcining at 950° C. for 5 hours (FIG. 4) has a structure wherein the coating containing silver and platinum is permeated into the superconducting composite layer only in parts, while the rest of the portions is retained in the intermediate layer.

EXAMPLE 2, COMPARATIVE EXAMPLE 2

Superconducting thick film circuit boards having circuit widths of 0.5 mm and 3 mm were obtained in the same manner as described in Example 1 except for using a zirconia substrate stabilized by using yttrium oxide in place of cerium oxide (Halox 480, a trade name, mfd. by Hitachi Chemical Ceramics Co., Ltd.) and using calcining conditions as listed in Table 1.

The resulting superconducting thick film circuit boards were subjected to the measurement of $T_c^{onset}$, $T_c^{zero}$ and Jc, observation of the presence of rod-like crystals in the superconducting composite layer, and calculation of the ratio of long axis/short axis. The results are shown in Table 2. In Table 2, Jc means the Jc at the liquid nitrogen temperature (77.3K).

TABLE 2

| Calcining conditions | | | | Jc (A/cm$^2$) | | Ratio of long axis/short axis |
| --- | --- | --- | --- | --- | --- | --- |
| Temperature (°C.) | Time (hr) | $T_c^{onset}$ (K) | $T_c^{zero}$ (K) | Circuit width 0.5 mm | Circuit width 3.0 mm | of rod-like crystals |
| 960 | 5 | 91.3 | 90.1 | 150 | 135 | No rod-like crystals |
| 980 | 5 | 92.5 | 90.4 | 740 | 540 | " |
| 1000 | 5 | 92.8 | 89.9 | 1530 | 1390 | 8–13 |
| 1020 | 5 | 92.4 | 90.8 | 1780 | 1710 | 10–14 |
| 1040 | 5 | 92.1 | 90.0 | 1500 | 1600 | 9–12 |
| 1040 | 0.2 | 92.7 | 90.4 | 1130 | 1240 | 10–15 |
| 1060 | 0.2 | 92.4 | 90.3 | 2010 | 1980 | 10–17 |
| 1080 | 0.2 | 91.9 | 90.1 | 1630 | 1630 | 8–14 |
| 1100 | 0.1 | 92.0 | 89.8 | 570 | 720 | Unmeasurable |

As is clear from Table 2, the superconducting thick film circuit boards obtained by calcining at 1000° to 1080° C. form the rod-like crystal superconducting composite layers, have Jc of 1130 A/cm$^2$ or more, show almost no difference between the circuit width of 0.5 mm and that of 3 mm, and show good superconducting properties with the ratio of long axis/short axis of 8 or more. $T_c^{onset}$ and $T_c^{zero}$ are as good as 89.9K or higher.

In contrast, the superconducting thick film circuit boards obtained by calcining at 960° to 980° C. show good values of $T_c^{onset}$ and $T_c^{zero}$ of 90.1K or higher, but do not deposit rod-like crystals and have Jc of less than 1000 A/cm$^2$. Further, the superconducting thick film circuit board obtained by calcining at 1100° C. shows good values in both $T_c^{onset}$ and $T_c^{zero}$ of 89.8K or higher, but is impossible for measuring the ratio of long axis/short axis of rod-like crystals, and has Jc of less than 1000 A/cm$^2$.

EXAMPLE 3, COMPARATIVE EXAMPLE 3

Superconducting thick film circuit boards having circuit widths of 0.5 mm and 3 mm were obtained in the same manner as described in Example 1 except for using Er$_2$O$_3$ (purity 99.9%, mfd. by High Purity Chemetals Co., Ltd.) in place of Y$_2$O$_3$ as a starting material.

The obtained superconducting thick film circuit boards were subjected to the measurement of $T_c^{onset}$, $T_c^{zero}$ and Jc, observation of the presence of rod-like crystals in the superconducting composite layers, and calculation of the ratio of long axis/short axis.

The results are shown in Table 3. In Table 3, Jc means the Jc at the liquid nitrogen temperature (77.3K).

TABLE 3

| Calcining conditions | | $T_c^{onset}$ (K) | $T_c^{zero}$ (K) | Jc (A/cm$^2$) | | Ratio of long axis/short axis of rod-like crystals |
|---|---|---|---|---|---|---|
| Temperature (°C.) | Time (hr) | | | Circuit width 0.5 mm | Circuit width 3.0 mm | |
| 940 | 5 | 94.3 | 91.3 | 250 | 320 | No rod-like crystals |
| 960 | 5 | 95.2 | 90.6 | 830 | 910 | '' |
| 980 | 5 | 94.0 | 90.9 | 1370 | 1360 | 8–12 |
| 1000 | 5 | 94.9 | 91.3 | 1490 | 1500 | 10–15 |
| 1020 | 5 | 95.0 | 91.3 | 1680 | 1710 | 9–16 |
| 1040 | 5 | 94.8 | 92.1 | 1570 | 1600 | 10–17 |
| 1040 | 0.2 | 95.1 | 91.6 | 1540 | 1610 | 11–18 |
| 1060 | 0.2 | 94.3 | 92.0 | 2030 | 2130 | 9–13 |
| 1080 | 0.2 | 93.2 | 91.2 | 1010 | 1100 | 8–14 |
| 1100 | 0.1 | 92.8 | 90.1 | 630 | 710 | Unmeasurable |

As shown in Table 3, the superconducting thick film circuit boards obtained by calcining at 980° to 1080° C. form rod-like crystals superconducting composite layers, have Jc of 1040 A/cm$^2$ or more, show slight differences between the circuit width of 0.5 mm and that of 3 mm, and show good superconducting properties with the ratio of long axis/short axis of 8 or more. $T_c^{onset}$ and $T_c^{zero}$ are as good as 90.9K or higher.

In contrast, the superconducting thick film circuit boards obtained by calcining at 940° to 960° C. show good values of $T_c^{onset}$ and $T_c^{zero}$ of 90.6K or higher, but do not deposit rod-like crystals and have Jc of less than 1000 A/cm$^2$. Further, the superconducting thick film circuit board obtained by calcining at 1100° C. shows good values in both $T_c^{onset}$ and $T_c^{zero}$ of 90.1K or higher, but is impossible for measuring the ratio of long axis/short axis of rod-like crystals, and has Jc of less than 1000 A/cm$^2$.

COMPARATIVE EXAMPLE 4

Superconducting thick film circuit boards having circuit widths of 0.5 mm and 3 mm were obtained in the same manner as described in Example 1 except for screen printing the paste for superconductor obtained in Example 1 directly on the zirconia substrate without using the paste containing silver and platinum and using the calcining conditions as shown in Table 4.

The obtained superconducting thick film circuit boards were subjected to the measurement of $T_c^{onset}$, $T_c^{zero}$ and Jc, and observation of the presence of rod-like crystals in the superconducting composite layers.

The results are shown in Table 4. In Table 4, Jc means the Jc at the liquid nitrogen temperature (77.3K).

TABLE 4

| Calcining conditions | | $T_c^{onset}$ (K) | $T_c^{zero}$ (K) | Jc (A/cm$^2$) | | Presence of rod-like crystals |
|---|---|---|---|---|---|---|
| Temperature (°C.) | Time (hr) | | | Circuit width 0.5 mm | Circuit width 3 mm | |
| 940 | 5 | 89.4 | 10 | Unmeasurable | Unmeasurable | None |
| 960 | 5 | 90.1 | 10 | '' | '' | '' |
| 980 | 5 | 88.3 | 14.5 | '' | '' | '' |
| 1000 | 5 | 84.6 | 28.4 | '' | '' | '' |
| 1020 | 5 | 89.2 | 30.2 | '' | '' | '' |
| 1040 | 5 | 90.1 | 35.2 | '' | '' | '' |
| 1060 | 5 | 87.4 | 31.3 | '' | '' | '' |

As shown in Table 4, the superconducting thick film circuit boards produced by the process of Comparative Example 4 did not form rod-like crystal superconducting composite layers under the calcining conditions shown in Table 4. Thus, Jc could not be measured. $T_c^{onset}$ was 84.6K or higher which value is higher than the liquid nitrogen temperature, but $T_c^{zero}$ was below the liquid nitrogen temperature in each case and no superconductivity was shown at the liquid nitrogen temperature.

EXAMPLE 4

A silver/platinum paste was obtained by uniformly mixing 97 parts of silver powder (AY-6080, a trade name, mfd. by Tanaka Matthey Co., Ltd.), 3 parts of platinum dioxide (reagent grade, mfd. by Wako Pure Chemical Industries, Ltd.), 5 parts of ethyl cellulose (45 cp, mfd. by Wako Pure Chemical Industries, Ltd.) as an organic binder, and 20 parts of terpineol (reagent 1st grade, mfd. by Wako Pure Chemical Industries, Ltd.) as an organic solvent.

Then, the superconductor paste obtained in Example 1 was screen printed on the same circuit of a silver/platinum coating formed by using the paste mentioned above, followed by calcining at 1020° C. for 5 hours in an oxygen atmosphere to give a superconducting thick film circuit board having circuit widths of 0.5 mm and 3 mm.

The obtained superconducting thick film circuit board was subjected to the measurement of $T_c^{onset}$, $T_c^{zero}$ and Jc, observation of the presence of rod-like crystals in the superconducting composite layer and calculation of the ratio of long axis/short axis.

The results are shown in Table 5. In Table 5, Jc means the Jc at the liquid nitrogen temperature (77.3K).

TABLE 5

| $T_c^{onset}$ (K) | $T_c^{zero}$ (K) | Jc (A/cm$^2$) | | Ratio of long axis/short axis of rod-like crystals |
|---|---|---|---|---|
| | | Circuit width 0.5 mm | Circuit width 3 mm | |
| 92.1 | 90.6 | 1430 | 1570 | 9–15 |

As shown in Table 5, the superconducting thick film circuit board obtained by using the silver/platinum paste forms a rod-like superconducting composite layer, has Jc of 1430 A/cm² or more, shows a slight difference between the circuit widths of 0.5 mm and 3 mm, and shows good superconducting properties with the ratio of long axis/short axis of 9 or more. $T_c^{onset}$ and $T_c^{zero}$ are as good as 90.6K or more.

EXAMPLE 5, COMPARATIVE EXAMPLE 5

A thick film sintered body was obtained by screen printing the same paste containing silver and platinum as used in Example 1 on a zirconia sintered body stabilized with cerium oxide (mfd. by Hitachi Chemical Ceramics, Co., Ltd.), drying at 100° C. for 30 minutes and calcining at 900° C. for 10 minutes in the air to form a coating containing silver and platinum.

Then, a thick film superconductor was obtained by screen printing using the same paste for superconductor as used in Example 1 on the coating containing silver and platinum in the same shape and calcining in an oxygen atmosphere under the conditions as shown in Table 6.

The resulting thick film superconductors were subjected to the measurement of $T_c^{onset}$, $T_c^{zero}$ and Jc, observation of the presence of rod-like crystals in the rod-like crystals in the superconducting composite layers and calculation of the ratio of long axis/short axis.

The results are shown in Table 6. In Table 6, Jc means the Jc at the liquid nitrogen temperature (77.3K).

Calculated values of Jc at individual calcining temperatures when an external magnetic field is applied are shown in Table 7.

TABLE 6

| Calcining conditions | | | | | Ratio of long axis/short axis of rod-like crystals |
|---|---|---|---|---|---|
| Tempera- ture (°C.) | Time (hr) | $T_c^{onset}$ (K) | $T_c^{zero}$ (K) | Jc | |
| 940 | 5 | 92.4 | 90.1 | 150 | No rod-like crystals |
| 960 | 5 | 90.5 | 89.7 | 240 | " |
| 980 | 5 | 91.6 | 90.1 | 980 | " |
| 1000 | 5 | 93.1 | 90.8 | 1490 | 8–12 |
| 1020 | 5 | 92.5 | 90.0 | 1640 | 10–14 |
| 1040 | 5 | 91.4 | 89.9 | 1420 | 8–12 |
| 1040 | 0.2 | 92.3 | 90.1 | 1040 | 10–15 |
| 1060 | 0.2 | 92.0 | 90.3 | 2000 | 10–17 |
| 1080 | 0.1 | 91.8 | 90.2 | 1220 | 8–14 |
| 1100 | 0.1 | 91.3 | 89.8 | 490 | Unmeasurable |

TABLE 7

| Calcining conditions | | Jc (A/cm²) External magnetic field ($\times 10^{-4}$ T) | | | | | |
|---|---|---|---|---|---|---|---|
| Tempera- ture (°C.) | Time (hr) | 0 | 10 | 50 | 100 | 200 | 500 |
| 940 | 5 | 150 | 50 | 10 | 2 | 2 | 1 |
| 980 | 5 | 980 | 330 | 130 | 45 | 21 | 9 |
| 1020 | 5 | 1640 | 1230 | 840 | 790 | 730 | 680 |
| 1060 | 0.2 | 2000 | 1580 | 1310 | 1200 | 1050 | 980 |

As shown in Table 6, the thick film superconductors produced by calcining at 1000° to 1080° C. form rod-like crystals superconducting composite layers, have Jc of 1040 A/cm² or more, and show good superconducting properties with the ratio of long axis/short axis of 8 or more. $T_c^{onset}$ and $T_c^{zero}$ are as good as 89.9K or higher.

In contrast, the thick film superconductors obtained by calcining at 940° to 980° C. show good values of $T_c^{onset}$ and $T_c^{zero}$ of 89.7K or higher, but do not deposit rod-like crystals and have Jc of less than 1000 A/cm². Further, the thick film superconductor obtained by calcining at 1100° C. shows good values in both $T_c^{onset}$ and $T_c^{zero}$ of 89.7K or high, but does not deposit rod-like crystals and has Jc of less than 1000 A/cm².

Further, as shown in Table 7, the thick film superconductors obtained by calcining at 1020° to 1060° C. only slightly lower the Jc even if the external magnetic field of $500 \times 10^{-4}$ T is applied.

In contrast, the thick film superconductors obtained by calcining at 940° to 980° C. remarkably lower the Jc when the external magnetic field is applied.

As mentioned above, the superconducting thick film circuit boards and the thick film superconductors of the present invention have $T_c^{onset}$ and $T_c^{zero}$ of 77K or higher and are able to use liquid nitrogen. Further, even in the case of circuit width of 0.5 mm, the superconducting thick film circuit board has Jc of 1000 A/cm² or more. On the other hand, the thick film superconductor slightly lowers Jc, even if an external magnetic field is applied. Thus, the superconducting thick film circuit boards and the thick film superconductors of the present invention are remarkably suitable for industrial uses.

What is claimed is:

1. A superconducting thick film circuit board comprising a zirconia substrate stabilized by the addition of a stabilizer selected from the group consisting of yttrium oxide, cerium oxide and calcium oxide, a coating of a composite of silver and platinum formed on the substrate, and formed thereon a superconducting composite layer containing crystals and comprising a superconductor made of a compound of the formula: M-Ba-Cu-O, wherein M is Y or Er and wherein an atomic ratio of M:Ba:Cu is $1\pm0.1:2\pm0.2:3\pm0.3$, said crystals having a rod shape and said coating of a composite of silver and platinum almost penetrating into said superconducting composite layer.

2. A superconducting thick film circuit board according to claim 1, wherein the compound of M-Ba-Cu-O has an atomic ratio of M:Ba:Cu of 1:2:3.

3. A superconducting thick film circuit board according to claim 1, wherein the composite of silver and platinum comprises a mixture of silver and platinum wherein the mixing ratio of silver and platinum is 99.9 to 90% by weight of silver and 0.1 to 10% by weight of platinum.

4. A superconducting thick film circuit board according to claim 1, wherein said crystals having a rod shape have a small diameter with a long axis longer than a short axis, the ratio of long axis/short axis being 5 to 18.

5. A superconducting thick film circuit board according to claim 1, wherein the superconductor is made of a compound of Y-Ba-Cu-O or Er-Ba-Cu-O.

6. A superconducting thick film circuit board according to claim 1, wherein the coating of a composite of silver and platinum almost penetrating into the superconducting composite layer is obtained by calcining at a temperature of 980° C. or higher and lower than 1,100° C.

* * * * *